US006946884B2

(12) United States Patent
Holland et al.

(10) Patent No.: US 6,946,884 B2
(45) Date of Patent: Sep. 20, 2005

(54) FRACTIONAL-N BASEBAND FREQUENCY SYNTHESIZER IN BLUETOOTH APPLICATIONS

(75) Inventors: William Eric Holland, Lynchburg City, VA (US); Wenzhe Luo, Allentown, PA (US); Zhigang Ma, Allentown, PA (US); Dale H. Nelson, Macungie, PA (US); Harold Thomas Simmonds, Stewartsville, NJ (US); Lizhong Sun, Budd Lake, NJ (US); Xiangqun Sun, Randolph, NJ (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 10/131,210

(22) Filed: Apr. 25, 2002

(65) Prior Publication Data

US 2003/0201805 A1 Oct. 30, 2003

(51) Int. Cl.[7] .......................... H03K 21/00

(52) U.S. Cl. .................. 327/115; 327/117; 327/157; 331/25; 375/376

(58) Field of Search .................. 327/113–115, 117, 327/118, 156–159, 105, 107, 147–150; 331/1 A, 18, 25, 34, 177 R, 1 R, 40, 48; 377/47, 48; 375/374–376, 327; 455/260

(56) References Cited

U.S. PATENT DOCUMENTS

| | | | | | |
|---|---|---|---|---|---|
| 4,107,612 | A | * | 8/1978 | Leveque | 455/125 |
| 4,965,531 | A | * | 10/1990 | Riley | 331/1 A |
| 5,059,924 | A | * | 10/1991 | JenningsCheck | 331/1 A |
| 5,079,521 | A | * | 1/1992 | Gaskell et al. | 331/1 A |
| 5,095,288 | A | * | 3/1992 | Dent | 331/17 |
| 5,420,545 | A | * | 5/1995 | Davis et al. | 331/17 |
| 5,604,468 | A | * | 2/1997 | Gillig | 331/176 |
| 5,610,559 | A | * | 3/1997 | Dent | 331/2 |
| 5,694,089 | A | * | 12/1997 | Adachi et al. | 331/16 |
| 5,821,816 | A | * | 10/1998 | Patterson | 331/1 A |
| 5,834,987 | A | * | 11/1998 | Dent | 332/127 |
| 5,847,611 | A | * | 12/1998 | Hirata | 331/1 A |
| 5,847,615 | A | * | 12/1998 | Roth | 331/16 |
| 5,889,436 | A | * | 3/1999 | Yeung et al. | 331/2 |
| 5,903,194 | A | * | 5/1999 | Opsahl et al. | 331/1 A |
| 5,977,836 | A | * | 11/1999 | Swan et al. | 331/1 A |
| 6,008,703 | A | * | 12/1999 | Perrott et al. | 332/100 |
| 6,069,535 | A | * | 5/2000 | Khlat | 331/1 A |
| 6,215,834 | B1 | * | 4/2001 | McCollough | 375/375 |
| 6,219,397 | B1 | * | 4/2001 | Park | 375/376 |
| 6,236,275 | B1 | * | 5/2001 | Dent | 331/1 A |
| 6,236,703 | B1 | * | 5/2001 | Riley | 377/48 |
| 6,249,189 | B1 | * | 6/2001 | Wu et al. | 331/18 |
| 6,308,048 | B1 | * | 10/2001 | Gore et al. | 455/76 |
| 6,392,493 | B1 | * | 5/2002 | Minnis | 331/1 A |
| 6,456,164 | B1 | * | 9/2002 | Fan | 331/16 |
| 6,501,816 | B1 | * | 12/2002 | Kouznetsov et al. | 377/48 |
| 6,504,437 | B1 | * | 1/2003 | Nelson et al. | 331/14 |
| 6,504,498 | B1 | * | 1/2003 | O'Brien | 341/143 |
| 6,509,800 | B2 | * | 1/2003 | Stockton | 331/11 |
| 6,553,089 | B2 | * | 4/2003 | Huh et al. | 375/376 |
| 6,600,378 | B1 | * | 7/2003 | Patana | 331/1 A |
| 6,614,319 | B2 | * | 9/2003 | Saeki et al. | 331/17 |
| 6,621,356 | B2 | * | 9/2003 | Gotz et al. | 331/25 |

* cited by examiner

*Primary Examiner*—Timothy P. Callahan
*Assistant Examiner*—Hai L. Nguyen

(57) ABSTRACT

A baseband clock synthesizer having particular use in a BLUETOOTH piconet device, having the capability of generating either 12 MHz or 13 MHz clock signals generated from any reference clock signal, e.g., 12.00, 12.80, 13.00, 15.36, 16.80, 19.20, 19.44, 19.68, 19.80, and 26.00 MHz. A fractional-N frequency divider is implemented with a PLL including a variable divider allowing the use of virtually any reference frequency input to generate a locked 156 MHz clock signal used as a basis for a 12 MHz or 13 MHz baseband clock signal. A residue feedback sigma-delta modulator provides a varying integer sequence to an integer divider in a feedback path of the PLL, effectively allowing division by non-integer numbers in the PLL. Thus, the PLL can be referenced to virtually any reference clock and still provide a fixed output clock signal (e.g., 12 or 13 MHz).

13 Claims, 8 Drawing Sheets

Architecture of the bluetooth baseband clock synthesizer using frac-N PLL

Architecture of the bluetooth baseband clock synthesizer using frac-N PLL

Exemplary Sigma-Delta Modulator

FRACTIONAL-N BASEBAND FREQUENCY SYNTHESIZER IN BLUETOOTH APPLICATIONS

BACKGROUND OF THE INVENTION

1. Field of the Invention

The present invention relates to piconet wireless networks. More particularly, it relates to baseband clock generation for BLUETOOTH™ radio frequency (RF) integrated circuits.

2. Background of Related Art

Piconets, or small wireless networks, are being formed by more and more devices in many homes and offices. In particular, a popular piconet standard is commonly referred to as a BLUETOOTH piconet. Piconet technology in general, and BLUETOOTH technology in particular, provides peer-to-peer communications over short distances.

The wireless frequency of piconets may be 2.4 GHz as per BLUETOOTH standards, and/or typically have a 20 to 100 foot range. The piconet RF transmitter may operate in common frequencies which do not necessarily require a license from the regulating government authorities, e.g., the Federal Communications Commission (FCC) in the United States. Alternatively, the wireless communication can be accomplished with infrared (IR) transmitters and receivers, but this is less preferable because of the directional and visual problems often associated with IR systems.

A plurality of piconet networks may be interconnected through a scatternet connection, in accordance with BLUETOOTH protocols. BLUETOOTH network technology may be utilized to implement a wireless piconet network connection (including scatternet). The BLUETOOTH standard for wireless piconet networks is well known, and is available from many sources, e.g., from the web site www.bluetooth.com.

According to the BLUETOOTH specification, BLUETOOTH systems typically operate in a range of 2400 to 2483.5 MHz, with multiple RF channels. For instance, in the US, 79 RF channels are defined as f=2402+k MHz, k=0, . . . , 78. This corresponds to 1 MHz channel spacing, with a lower guard band (e.g., 2 MHz) and an upper guard band (e.g., 3.5 MHz).

To receive a radio frequency (RF) signal from another piconet device, the receiving device must lock onto the transmitted frequency. All receiving devices have a local clock on which a baseband receive clock signal in an RF section is based.

Currently, there are two RF interface standards for the RF section of BLUETOOTH devices: Blue-Q from QUALCOMM INC. and Blue-RF from the Bluetooth RF Committee. Blue-Q uses a 12 MHz clock for baseband and oversampling clock signals. Blue-RF, the other current BLUETOOTH RF standard, uses a 13 MHz clock for baseband and oversampling clock signals. BLUETOOTH RF integrated circuits are designed based either on a 12 MHz clock signal (Blue-Q), or on a 13 MHz clock signal (Blue-RF).

It is important to note that in the real world, clock signals jitter and vary somewhat within desired tolerable limits. Other than the frequency requirements, the BLUETOOTH standard specifies that the clock jitter (rms value) should not exceed 2 nS and the settling time should be within 250 uS. A significant source of clock variation is the variance between external crystal oscillators installed in any particular BLUETOOTH device. Temperature also causes variations in clock signals.

To meet these very tight limits, a system designer must optimize receive circuits based on the particular clock speed for which the system is designed (e.g., 12 MHz or 13 MHz). Thus, to support devices in both standards, an integrated circuit manufacturer must design and offer two distinct BLUETOOTH RF integrated circuits: one based on a 12 MHz clock, and another based on a 13 MHz clock.

There is a need for a simplified approach to support RF portions of piconet devices in general, and BLUETOOTH devices in particular.

SUMMARY OF THE INVENTION

In accordance with the principles of the present invention, a non-integer frequency divider, comprising a sequence controller to provide a sequence of varying integer division ratios, and an integer frequency divider responding to said sequence of integer division ratios. A time average of a division performed by the integer frequency divider effectively provides a non-integer division of an input frequency.

In accordance with another aspect of the present invention, a piconet baseband clock synthesizer comprises a fractional-N phase locked loop (PLL) providing one of a 12 MHz and a 13 MHz reference clock signal based on an input frequency, and a fractional-N divide ratio controller. The input frequency may be any of a variety of different frequencies.

BRIEF DESCRIPTION OF THE DRAWINGS

Features and advantages of the present invention will become apparent to those skilled in the art from the following description with reference to the drawings, in which.

DETAILED DESCRIPTION OF ILLUSTRATIVE EMBODIMENTS

The present invention provides a baseband clock synthesizer having particular use in a BLUETOOTH piconet device, which has the capability of generating either 12 MHz or 13 MHz clock signals generated from any reference clock signal.

Conventional clock synthesis devices in BLUETOOTH applications provide either a 12 MHz clock, or a 13 MHz clock, but don't provide the choice of either to the designer. This requires the inefficiencies in the design and manufacture of two different products to support 12 MHz and 13 MHz BLUETOOTH devices.

Moreover, and perhaps most importantly, conventional devices provide clock signals based on an external crystal oscillator provided specifically for use by the clock synthesis device. Thus, devices implementing a BLUETOOTH RF front end require the additional external crystal oscillator specifically required by the chosen BLUETOOTH RF integrated circuits.

The present invention appreciates that current BLUETOOTH integrated circuits are targeted primarily at cell phone applications. Within these applications, there are any one of many possible reference clock signals (referred to herein as TCXO) already available by exemplary commercially available cell phones. For instance, one sampling of conventional TCXO clock frequencies include 12.00, 12.80, 13.00, 15.36, 16.80, 19.20, 19.44, 19.68, 19.80, and 26.00 MHz. Bluetooth hosting systems include other frequencies, and the present invention is certainly not limited to only these frequencies.

In accordance with the principles of the present invention, a fractional-N frequency divider is implemented with a PLL including a variable divider allowing the use of virtually any reference frequency input to generate a locked 156 MHz clock signal used as a basis for a 12 MHz or 13 MHz baseband clock signal.

The disclosed baseband frequency synthesizer satisfies both current BLUETOOTH interface standards (and can accommodate any future interface standard) by accepting a variable TCXO input reference clock. Thus, a common RF integrated circuit system is provided including a clock synthesizer generating any one of many different TCXO frequencies, allowing the combination of both a Blue-Q interface and a Blue-RF interface on the same integrated circuit.

In the exemplary embodiment, the design uses a frac-N PLL to generate a fixed frequency of 156 MHz, and divide by 13 or 12 to generate 12/13 MHz, respectively.

Figure 1:
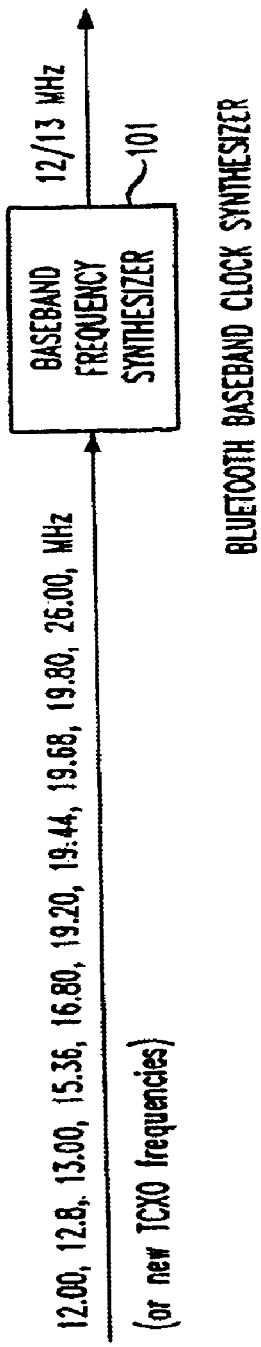
FIG. 1 shows a general function of the baseband clock synthesizer including a fractional-N controller, in accordance with the principles of the present invention.

FIG. 1 shows a general function of the baseband clock synthesizer including a fractional-N controller to generate either a 12 MHz or a 13 MHz clock signal with any of many possible reference clock frequencies already available in otherwise conventional devices (e.g., cell phone devices), in accordance with the principles of the present invention.

Figure 2:
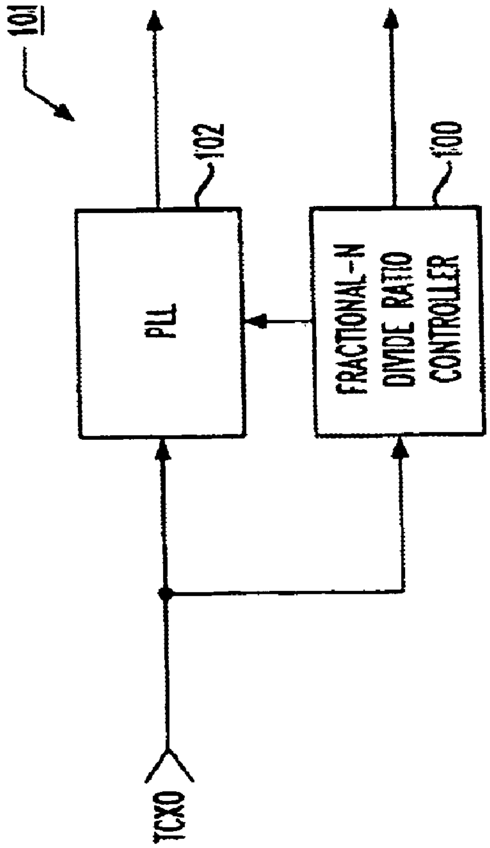
FIG. 2 shows a general block diagram of the phase locked loop (PLL) and fractional-N controller forming a baseband clock synthesizer, in accordance with the principles of the present invention.

FIG. 2 shows a general block diagram of the phase locked loop (PLL) and fractional-N controller forming a baseband clock synthesizer, in accordance with the principles of the present invention.

In particular, as shown in FIG. 2, the baseband frequency synthesizer 101 includes two main components: (A) a PLL 102 controlled by (B) a fractional-N divide ratio controller 100.

The disclosed PLL 102 is an otherwise classic integer-N PLL. In the disclosed embodiment, the PLL 102 outputs a frequency (e.g., 156 MHz, which is derived from 12 MHz× 13 MHz) which is easily divided into the desired output clock signals (12 MHz and 13 MHz).

The fractional-N divide ratio controller 100 allows division in the control of the PLL 102, e.g., in the feedback path of the PLL 102, by values effectively other than integer values, to allow flexibility in the ability to synthesize the desired output clock signal speeds (e.g., 12 MHz or 13 MHz) based on many different reference clock signals.

Figure 3:
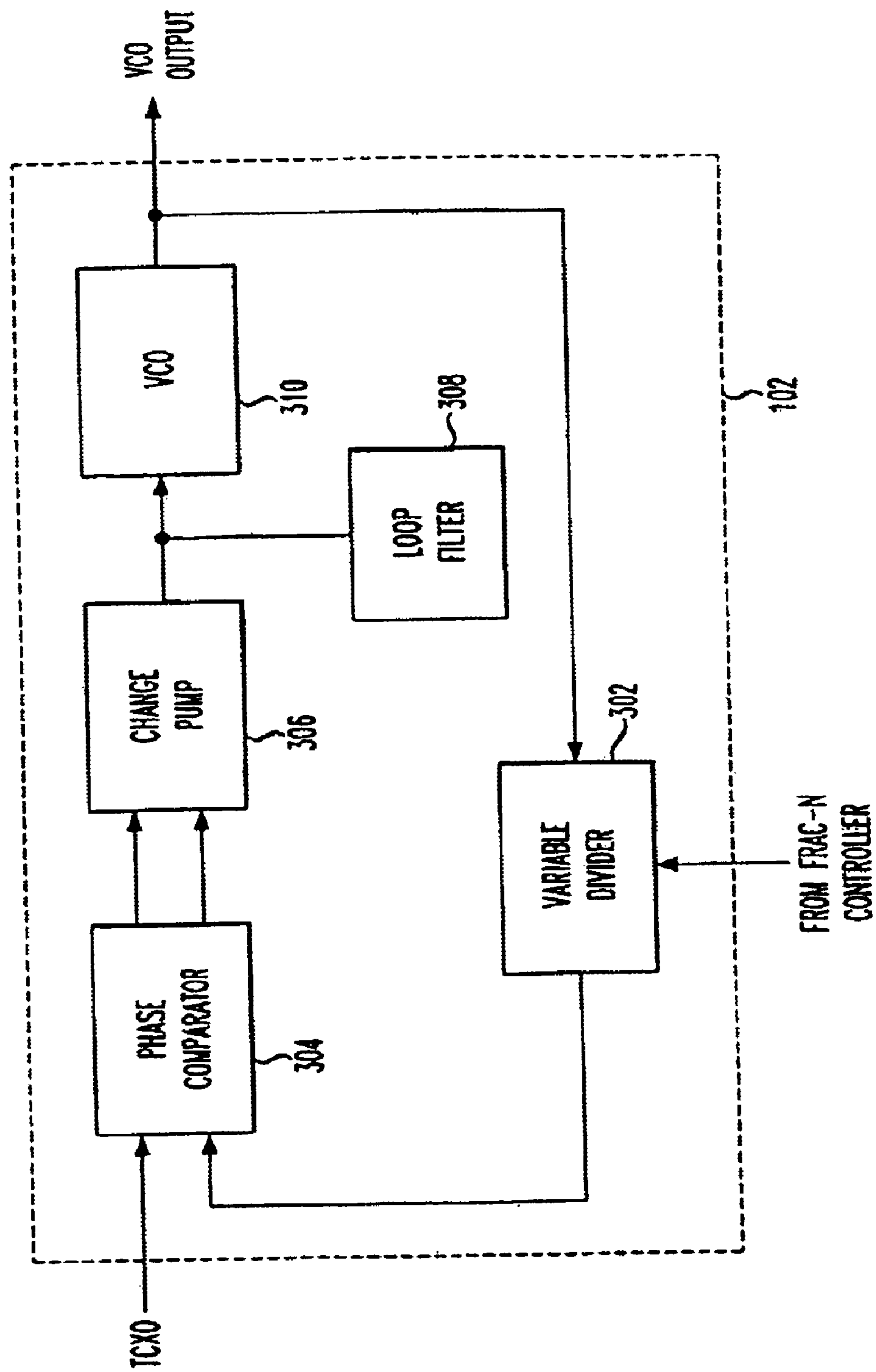
FIG. 3 shows a block diagram of an exemplary PLL including a variable divider, in accordance with the principles of the present invention.

FIG. 3 shows a block diagram of an exemplary PLL including a variable divider, in accordance with the principles of the present invention.

In particular, as shown in FIG. 3, the exemplary PLL 102 comprises an output path formed by a phase comparator 304, a charge-pump 306, a loop filter 308, and a voltage controlled oscillator (VCO) 310, and a feedback path formed by a variable frequency divider 302 between the output of the VCO 310 and a second input to the phase comparator 304.

The phase comparator 304 compares the phase of the input clock signal TCXO to the phase of the fed back, divided clock signal output from the variable divider 302.

The charge pump 306 is another fundamental component of a digital PLL which outputs a signal corresponding to the difference in the phase determined by the phase comparator 304.

The loop filter 308 (e.g., a large capacitor or integrater) holds the charge output from the charge pump 306 to steadily control the VCO 310.

The disclosed VCO 310 has a frequency of 156 MHz, based on the desired capability to provide either 12 MHz or 13 MHz. Of course, as other BLUETOOTH standards emerge, other VCO output frequencies having a frequency of a least common multiple of the desired output frequencies may be implemented, allowing use of an integer divider at the output of the PLL 102. Of course, if a non-integer divider is implemented at the output of the PLL virtually any suitable VCO output frequency may be implemented, within the principles of the present invention.

The variable divider 302 provides division of the feedback path by a integer value which can be changed from cycle to cycle. In accordance with the principles of the present invention, the time average of the integer values equate to a desired non-integer value of division in the variable divider 302.

The division performed by time average in the variable divider 302 is equated to a non-integer value which matches the VCO output clock speed to the clock speed of the input reference clock signal TCXO. Thus, with a change in the time averaged division value performed by the variable divider 302, the baseband frequency synthesizer 101 can function with any of many different reference clock signals TCXO.

For instance, the disclosed baseband frequency synthesizer 101 can function with any of 12.00, 12.80, 13.00, 15.36, 16.80, 19.20, 19.44, 19.68, 19.80, or 26.00 MHz input as a reference clock signal TCXO. To match any of these reference clock signals to the output of the VCO 310, a non-integer time averaged divider ratio in the feedback path of the PLL 102, i.e., in the variable divider 302, is required.

For instance, if the reference clock signal TCXO is 12.80 MHz (and presuming the output frequency of the VCO 310 is 156 MHz), the variable divider 302 must divide by a non-integer value: M=156/12.80=12.1875. In accordance with the principles of the present invention, the fractional-N divide ratio controller 100 (FIG. 2) provides control of the divide ratio of the variable divider 302 by time averaging an integer division of either 12 or 13.

As another example, if the reference clock signal TCXO is 15.36 MHz, the variable divider 302 must divide by a different non-integer value: M=156/15.36=10.15625, synthesized by a time average of the control of the variable divider 302 between the integer divisions of 10 and 11 to create an effective non-integer division of 10.15625.

Figure 4:
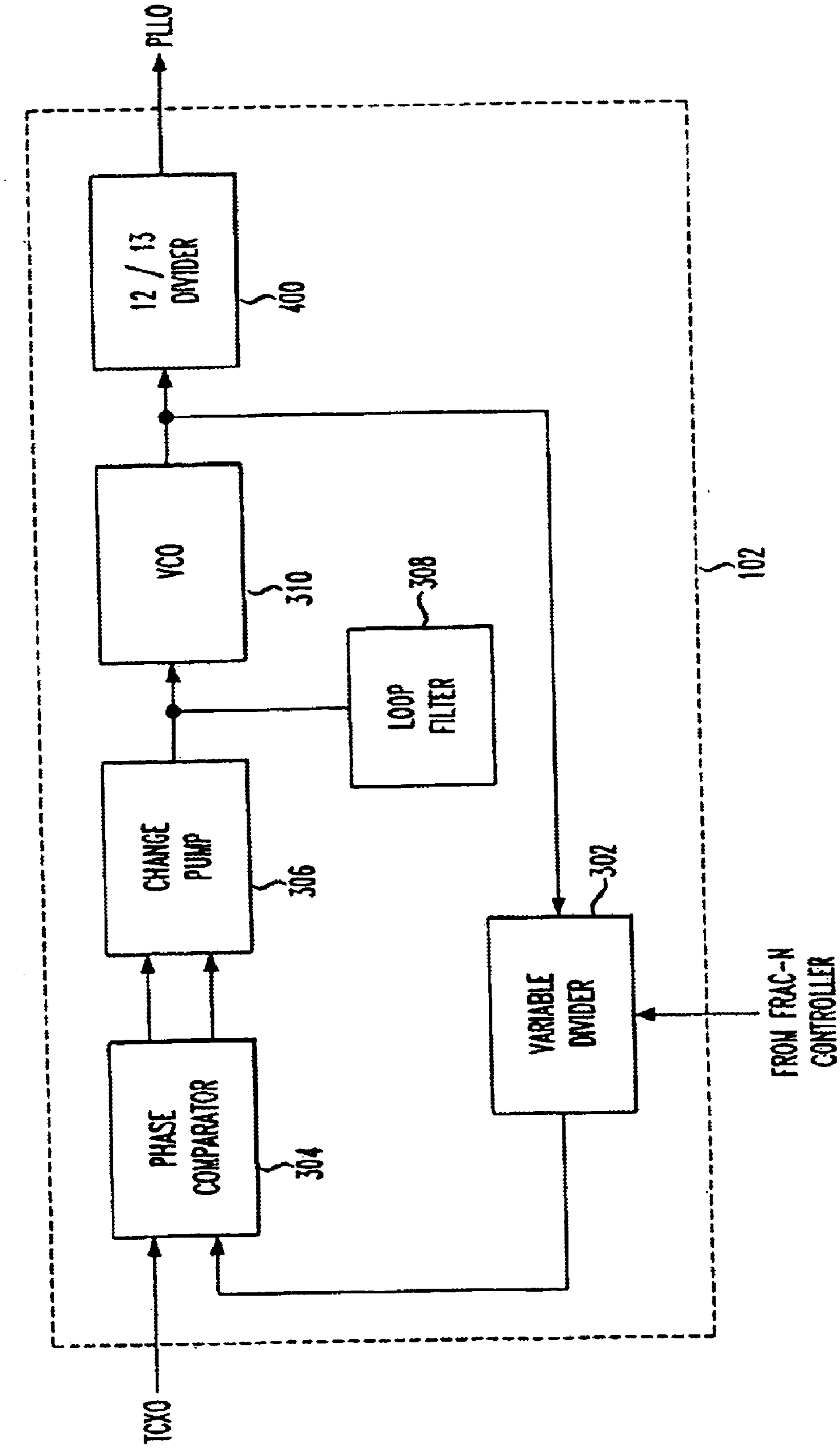
FIG. 4 shows the exemplary PLL including a variable divider as shown in FIG. 3, but further including a frequency divider to provide a 12 MHz or a 13 MHz clock signal, as is required by current BLUETOOTH RF integrated circuits, in accordance with the principles of the present invention.

FIG. 4 shows the exemplary PLL including a variable divider 302 as shown in FIG. 3, but further including an integer frequency divider 400 at the output of the VCO 310, in accordance with the principles of the present invention.

In the disclosed embodiment, the frequency divider 400 divides the common multiple output from the VCO 310 (i.e., 156 MHz) to generate either 12 MHz or 13 MHz PLL output signal PLLO, as is required by current BLUETOOTH RF integrated circuits. The frequency divider 400 can be programmably set, hardware jumpered, or otherwise selected or set to divide by 13 to provide a 12 MHz PLL output frequency, or to divide by 12 to provide a 13 MHz PLL output frequency, depending on the particular BLUETOOTH interface activated (Blue-Q/Blue-RF).

Figure 5:
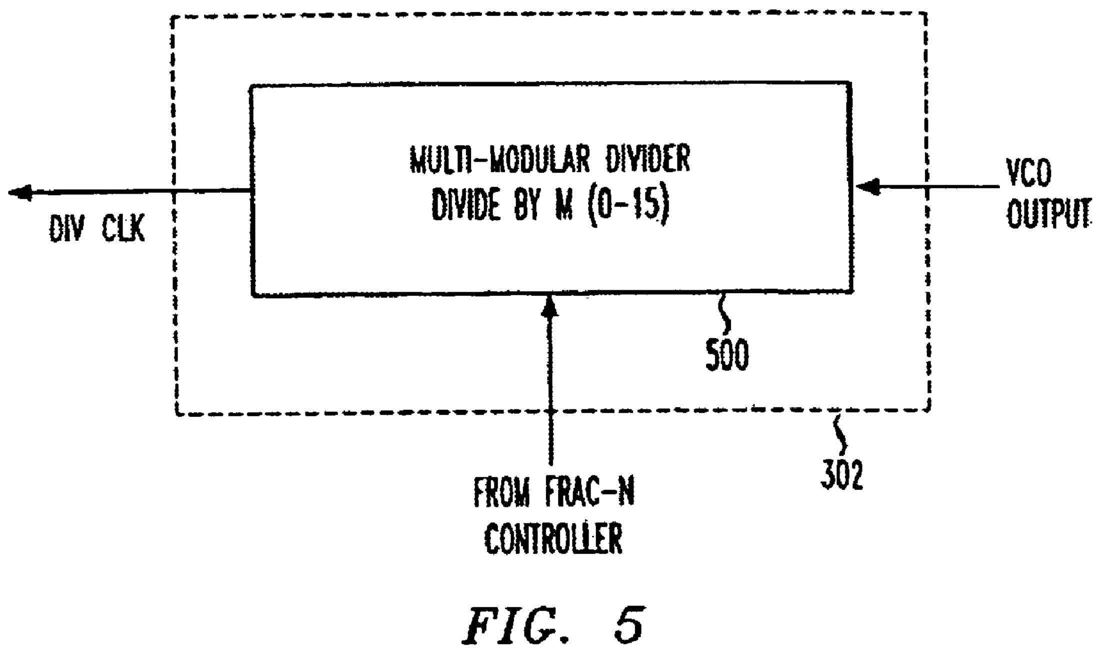
FIG. 5 shows the variable divider shown in FIGS. 3 and 4 in more detail.

FIG. 5 shows the variable divider 302 shown in FIGS. 3 and 4 in more detail.

In particular, as shown in FIG. 5, the variable frequency divider is a Muti-Modulus Divider which divides by a variable M. The variable frequency divider 302 in the PLL 102 is referred to as a "Multi-Modulus Divider" because it is capable of updating the divider ratio each time it completes a division cycle (i.e., each cycle of the output frequency).

The variable M is provided by the fractional-N divide ratio controller 100 (FIG. 2). While the variable M is a 16-bit number in the disclosed embodiment, other bit widths may be implemented within the principles of the present invention.

Figure 6:
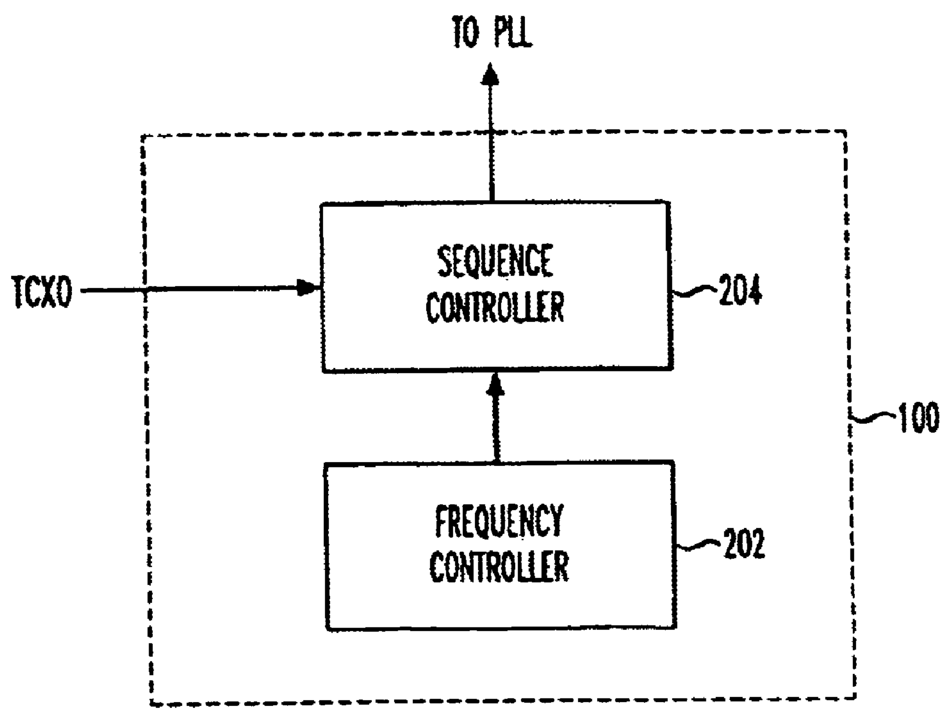
FIG. 6 shows the fractional-N controller shown in FIG. 2 in more detail.

FIG. 6 shows the fractional-N divide ratio controller 100 shown in FIG. 2 in more detail.

In particular, as shown in FIG. 6, the fractional-N divide ratio controller 100 includes a sequence controller 204, which provides the sequence of integer divide ratio values to the variable divider 302 in the PLL 102, and a frequency controller 202 to control the sequence controller 204.

The sequence controller 204 feeds the fractional-N divide ratio controller 100 with a variable M (e.g.M[3:0]) to approximate the fractional-N ratio by time averaging. While the variable M is 4 bits wide in the disclosed embodiments, any width of the variable M is within the scope of the present invention.

In accordance with the principles of the present invention, the sequence controller 204 outputs a sequence of control variables which, via time averaging, provide the fractional divide value for the fractional-N divide ratio controller 100.

For example, presume that the desired divide value for the fractional-N divide ratio controller 100 is 10.5. The non-integer value 10.5 cannot be placed directly in the fractional-N divide ratio controller 100. Rather, to approximate a division of 10.5 by the fractional-N divide ratio controller 100, the sequence controller 204 outputs a periodic pattern of integer values for M (10, 11, 10, 11, 10, 11, . . . ) to approximate 10.5 by time averaging. Integer values of M can be re-written each division period or cycle, providing a time average of 10.5.

Thus, although the non-integer ratio 10.5 cannot be placed directly into the variable frequency divider 302 as a division ratio, the integer values of 10 & 11 can be. Thus, by periodically or occasionally changing the division ratio in the variable frequency divider 302 (e.g., on a division cycle-by-division cycle or division period basis), time averaging effectively provides a non-integer division by the variable frequency divider 302.

Figure 7A:
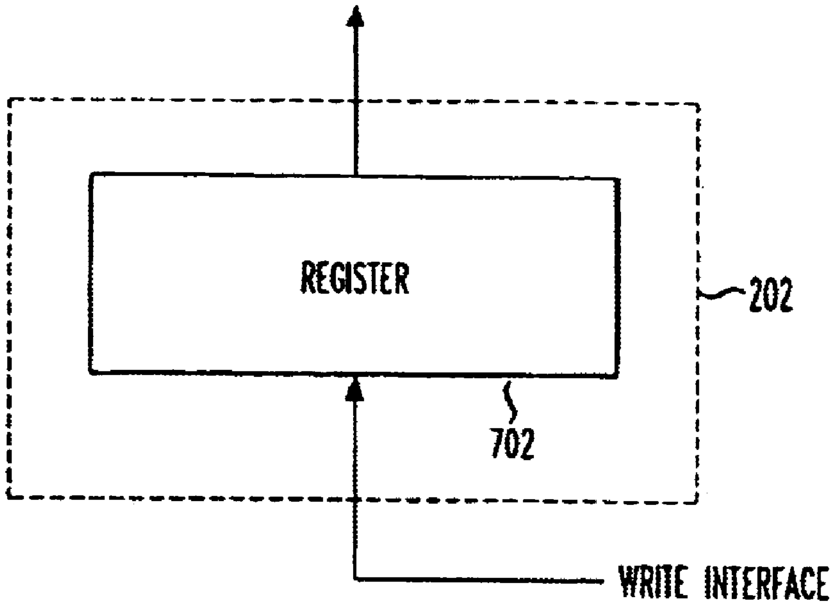
FIGS. 7A to 7C show exemplary embodiments of the frequency controller shown in FIG. 6.
Figure 7B:
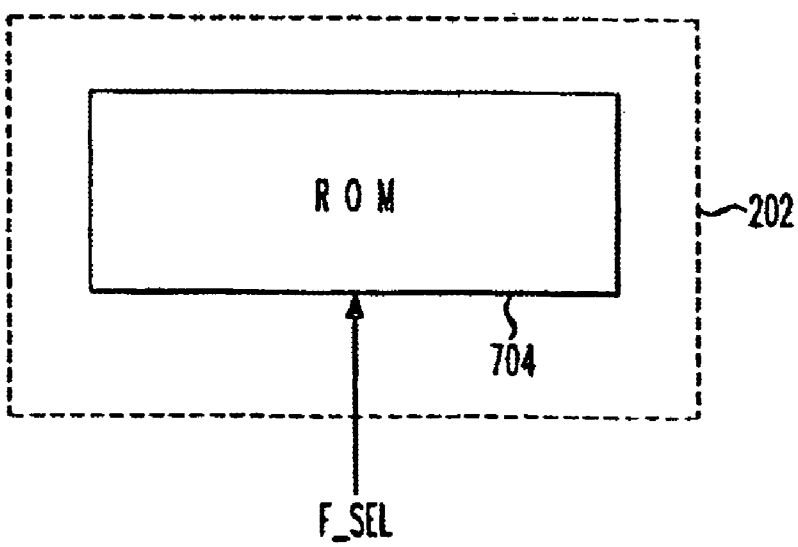
Figure 7C:
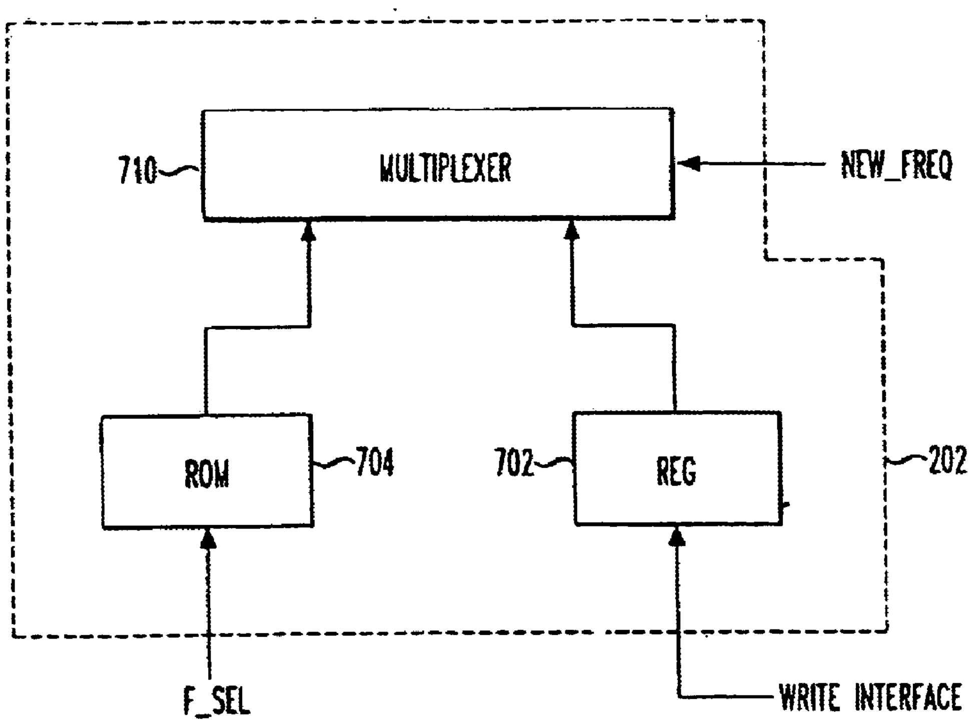

The frequency controller 202 may be formed from, e.g., a register, a read only memory (ROM), or other device which outputs digital data. FIGS. 7A to 7C show exemplary embodiments of the frequency controller 202 shown in FIG. 6.

In particular, FIG. 7A shows a frequency controller 202 comprising a register 702. The disclosed register is, e.g., a 19 bit register, though any bit-length register is within the scope of the present invention.

The register 702 may be programmably written to, preprogrammed or otherwise set to cause the sequence controller 204 to output a particular time-averaged non-integer division value M. The value M corresponds to the desired division ratio ($156/F_{TCXO}$).

The register 702 may be programmed by a suitable write interface (or R/W interface), or may be set in hardware or otherwise input.

FIG. 7B shows another implementation of a frequency controller 202 comprising a suitably sized memory component(s), e.g., a read only memory (ROM), The disclosed memory component is a ROM which is 19 bits wide (may be formed by multiple separate conventional width ROMS) by 10 address locations long. Of course, any other suitably sized ROM may be implemented within the scope of the present invention.

The particular output address of the ROM may be controlled by a suitable component, either programmably or by hardware selection. The 10 memory addresses in the disclosed ROM embodiment permits multiple divide ratio values for M to be preset for the convenience of the user, e.g., to cover ten (10) popularly used TCXO frequencies. As shown in FIG. 7B, a frequency signal F_SEL is input to the ROM to indicate the selection of a particular one of ten possible synthesized frequencies.

Table I shows exemplary content of the ROM 704 in the disclosed embodiment, based on an addressable frequency selection input index F_SEL[3:0].

TABLE I

TCXO Frequency and Fractional Divider Ratio

| F_SEL[3:0] | TCXO (MHz) | Ideal M | M[18:0] (Hex) |
|---|---|---|---|
| 0000 | 12.00 | 13 | 58000h |
| 0001 | 12.80 | 12.1875 | 51800h |
| 0010 | 13.00 | 12 | 50000h |
| 0011 | 15.36 | 10.15625 | 41400h |
| 0100 | 16.80 | 9.2857143 | 3A492h |
| 0101 | 19.20 | 8.125 | 31000h |
| 0110 | 19.44 | 8.0246914 | 30329h |
| 0111 | 19.68 | 7.9268293 | 2F6A2h |
| 1000 | 19.80 | 7.8787879 | 2F07Ch |
| 1001 | 26.00 | 6 | 20000h |

FIG. 7C shows a combination of both ROM functionality and register functionality in the frequency controller 202, in accordance with yet another embodiment of the present invention.

In particular, as shown in FIG. 7C, both the ROM 704 shown in FIG. 7B and the register 702 shown in FIG. 7A may be implemented using, e.g., a multiplexer 710. The multiplexer 710 may be a one-time, hardware configured selection of the source of the fractional divider ratio for input to the sequence controller 204, or may be programmably selected by a user of the baseband frequency synthesizer 101.

The multiplexer 710 allows selection between a data bus MA[18:0] from the ROM 704 (see FIG. 8), and another data bus MB[18:0] from the register 702. In operation, selection of the ROM 704 can be made if the particular reference clock signal TCXO is one that is already covered by a data set in the ROM 704. Otherwise, a custom value may be injected into the sequence controller 204 via the register 702 with an appropriate selection signal NEW_FREQ (FIG. 8) to the multiplexer 710.

Figure 8:
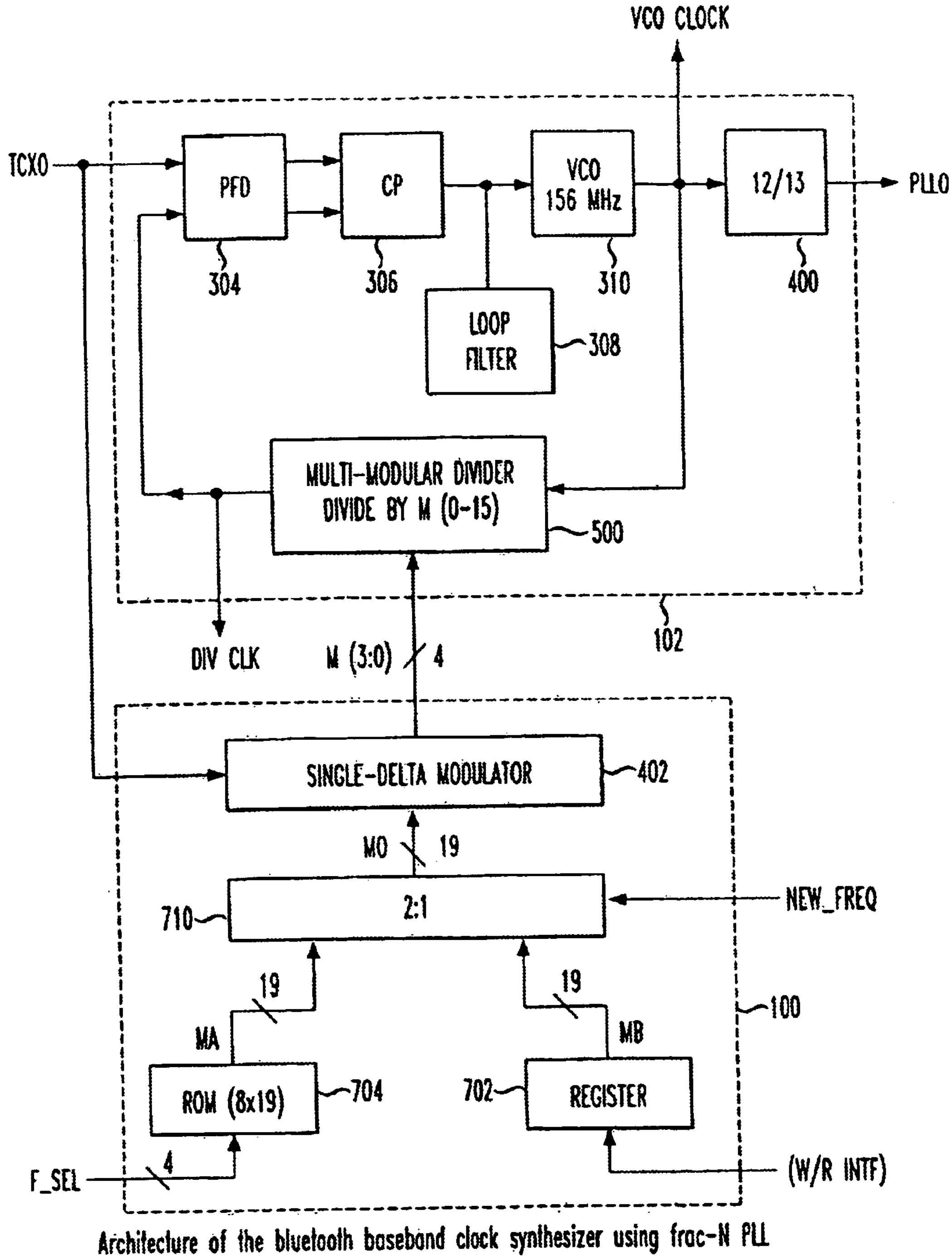
FIG. 8 shows the architecture of a baseband clock synthesizer using a fractional-N controller and PLL with a variable divider, in accordance with the principles of the present invention.

FIG. 8 shows an exemplary architecture of a piconet (e.g., BLUETOOTH) baseband clock synthesizer 101 using a fractional-N divide ratio controller 100 implementing a sigma-delta modulator (SDM), and a phase locked loop (PLL), in accordance with the principles of the present invention.

In particular, as shown in FIG. 8, the signal names of the frac-N frequency synthesizer are briefly explained in Table II below.

TABLE II

Brief explanation of signals

| Name | Type | Description |
|---|---|---|
| TCXO | input | Reference clock |
| M[3:0] | input | Fractional-N multi-modular divider control bits. M[3:0] changes on the falling edge of REFCLK. |
| VCOCLK | output | VCO output clock (156 MHz) |
| DIVCLK | output | Output of the frequency divider, which should be compared to TCXO in the phase comparator for decision of loop adjustment. |
| PLLO | output | VCO clock output (Blue-Q: 12 MHz, Blue-RF: 13 MHz) |
| F_SEL[3:0] | input | Frequency selection which covers the implemented TCXO frequencies. |
| W/R INTF | input | Write/Read interface for the 19-b register |
| NEW_F | input | New TCXO frequency, which is not covered by the implemented TCXO frequencies |
| MA[18:0] | internal | output from the ROM |
| MB[18:0] | internal | output from the register |
| MO[18:0] | internal | output from the multiplexer |

The variable-M sequence controller 204 shown in FIG. 6 is formed by a sigma-delta modulator 402, as shown in FIG. 8. The sigma-delta modulator 402 accepts a long fractional-N value MO[18:0] provided by the frequency controller 202 (e.g., via the ROM 704 or the register 702). In the given embodiment, the long fractional-N value has the form [4.15] (4-bits integer and 15-bits decimal), and generates a 4-bit M[3:0] sequence for time averaging. Of course, other data lengths are within the principles of the present invention.

Figure 9:
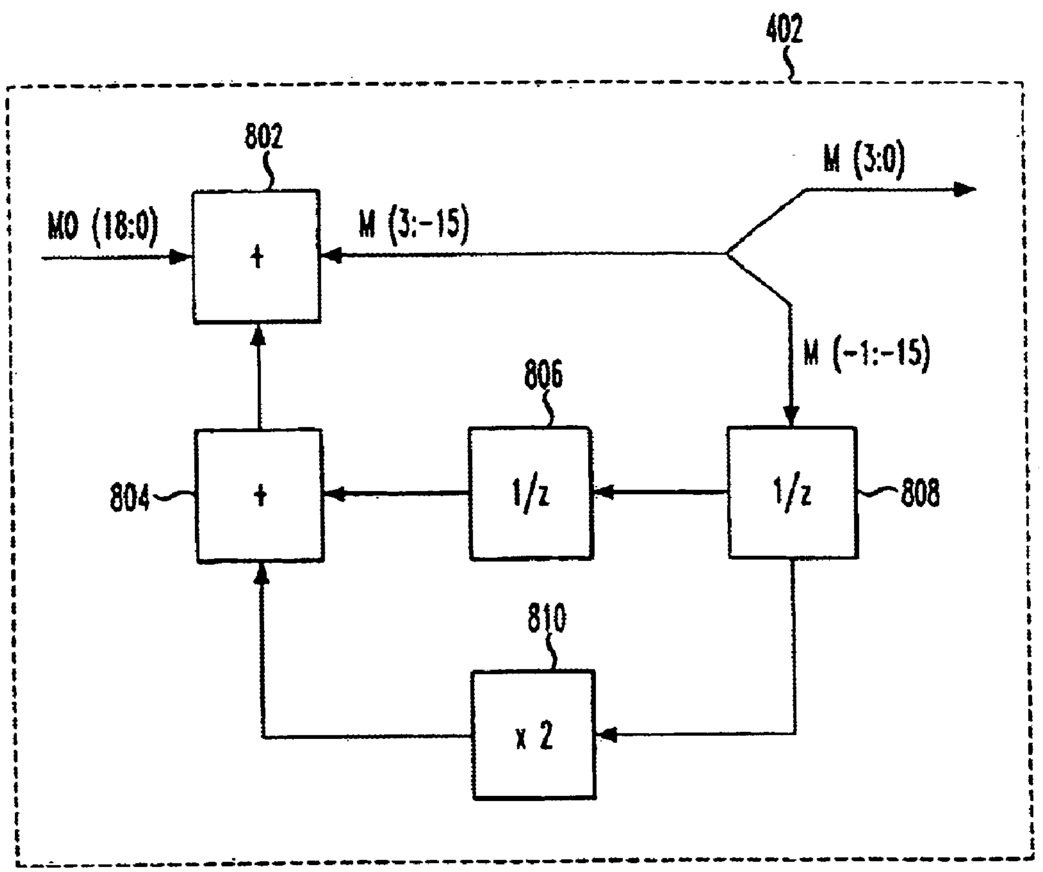
FIG. 9 shows an exemplary embodiment of the sequence controller in FIG. 6 formed by a residue feedback sigma-delta modulator, in accordance with the principles of the present invention.

FIG. 9 shows an exemplary embodiment of a sequence controller 204 shown in FIG. 6 formed by a residue feedback sigma-delta modulator 402, in accordance with the principles of the present invention.

The residue feedback in the sigma-delta modulator 402 is directly the decimal part, allowing a very concise VLSI implementation.

As shown in FIG. 9, the input to the sigma-delta modulator 402 MO[18:0] from the frequency controller 202 is the fractional-N ratio of 156 MHz/TCXO. This value is summed in a summer 808 with the output of a simple FIR, which takes the previous residue numbers (the decimal part of M, i.e., M[−1:−15]) as the input and does the operation of $-2Z^{-1}+Z^{-2}$. Therefore, the total operator of the sigma-delta modulator is $(1-Z^{-1})^2$.

The integer part of M[3:−15] is used as the divider ratio for the frequency divider. The sigma-delta modulator is closed by TCXO, therefore, the divider ratio will be updated with the TCXO frequency (which equals the divider output when the PLL locks).

While the present invention is shown and described with reference to piconet devices in general, and to BLUETOOTH devices in particular, it has equal applicability to other types of radio frequency (RF) transceivers.

While the invention has been described with reference to the exemplary preferred embodiments thereof, those skilled in the art will be able to make various modifications to the described embodiments of the invention without departing from the true spirit and scope of the invention.

What is claimed is:

1. A piconet baseband clock synthesizer, comprising:

a fractional-N phase locked loop (PLL) providing a fixed output reference frequency based on any of a plurality of possible fixed input frequencies;

a time-averaged divider in a feedback loop of said fractional-N phase locked loop; and a programmable integer divider receiving an output of said fractional-N phase locked loop;

wherein said input frequency may be any of a variety of different frequencies used to produce a desired output frequency for a particular piconet application.

2. The piconet baseband clock synthesizer according to claim 1, wherein:

said programmable integer divider provides either a 12 Mhz or a 13 MHz output frequency.

3. The piconet baseband clock synthesizer according to claim 1, wherein:

said piconet baseband clock synthesizer is a BLUETOOTH conforming piconet device.

4. The piconet baseband clock synthesizer according to claim 3, wherein said fractional-N phase locked loop (PLL) includes a circuit path comprising:

a phase detector, a charge pump, and a voltage controlled oscillator.

5. The piconet baseband clock synthesizer according to claim 4, further comprising:

wherein said programmable integer divider dividing by either 12 or 13 to provide 13 MHz or 12 MHz, respectively.

6. The piconet baseband clock synthesizer according to claim 4, further comprising:

a loop filter at an input to said voltage controlled oscillator.

7. The piconet baseband clock synthesizer according to claim 4, wherein:

said voltage controlled oscillator outputs a frequency at 156 MHz.

8. The piconet baseband clock synthesizer according to claim 1, wherein said fractional-N divide ratio controller comprises:

a sequence controller; and a frequency controller to input a fractional-N value to said sequence controller.

9. The piconet baseband clock synthesizer according to claim 8, wherein:

said frequency controller includes a register which is programmably set by a user of said piconet baseband clock synthesizer to accommodate a particular reference clock signal for said PLL.

10. The piconet baseband clock synthesizer according to claim 8, wherein said sequence controller comprises:

a sigma-delta modulator.

11. The piconet baseband clock synthesizer according to claim 10, wherein:

said sigma-delta modulator is in a residue feedback form.

12. A method of providing fractional-N division of an input fixed frequency reference clock signal, comprising:

varying an integer value of a division of said input fixed frequency reference clock signal on a per division cycle basis to provide a time averaged non-integer division of said fixed frequency reference clock signal to produce a least common multiple of a desired clock signal; and fixing an integer value of a division of fixed frequency output from a PLL including said varied integer value division.

13. The method of providing fractional-N division of an input fixed frequency reference clock signal according to claim 12, further comprising:

programmably altering integer values in a sequence to control a frequency divider between operation at one of two sequential integer values for any given fractional-N division value.

* * * * *